United States Patent
Lee

(10) Patent No.: US 9,051,637 B2
(45) Date of Patent: Jun. 9, 2015

(54) SECURING OF SHADOW MASK AND SUBSTRATE ON SUSCEPTOR OF DEPOSITION APPARATUS

(71) Applicant: Synos Technology, Inc., Fremont, CA (US)

(72) Inventor: Sang In Lee, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 323 days.

(21) Appl. No.: 13/666,840

(22) Filed: Nov. 1, 2012

(65) Prior Publication Data

US 2013/0122197 A1    May 16, 2013

Related U.S. Application Data

(60) Provisional application No. 61/558,132, filed on Nov. 10, 2011.

(51) Int. Cl.
  *C23C 16/04* (2006.01)
  *G03F 7/12* (2006.01)
  *H01L 51/00* (2006.01)

(52) U.S. Cl.
  CPC ............. *C23C 16/042* (2013.01); *G03F 7/12* (2013.01); *H01L 51/0011* (2013.01)

(58) Field of Classification Search
  None
  See application file for complete search history.

(56) References Cited

U.S. PATENT DOCUMENTS

| | | | |
|---|---|---|---|
| 4,746,548 A * | 5/1988 | Boudreau et al. | 427/248.1 |
| 2006/0014087 A1* | 1/2006 | Wittenberg et al. | 430/7 |
| 2008/0166880 A1* | 7/2008 | Levy | 438/758 |
| 2009/0291610 A1* | 11/2009 | Sasaki | 445/24 |
| 2011/0033726 A1 | 2/2011 | Sanuy et al. | |

FOREIGN PATENT DOCUMENTS

| | | |
|---|---|---|
| JP | 2010-084204 A | 4/2010 |
| KR | 10-2002-0066707 | 8/2002 |

* cited by examiner

*Primary Examiner* — Joseph Miller, Jr.
(74) *Attorney, Agent, or Firm* — Fenwick & West LLP

(57) ABSTRACT

Embodiments relate to a structure for securing a shadow mask and a susceptor where the top surface of the shadow mask mounted with the susceptor is flush with the top surface of the susceptor. When the susceptor is mounted with the shadow mask, the entire top surface of the susceptor and the shadow mask is substantially coplanar. A substrate onto which material is deposited is placed below the shadow mask. The susceptor moves below reactors for injecting materials or radicals. Since the entire top surface of the susceptor is substantially flat, the vertical distance between the reactors and the susceptor can be reduced, contributing to the overall quality of the layer formed on the substrate and reducing the materials wasted by leaking outside the gap between the susceptor and the reactors.

13 Claims, 5 Drawing Sheets

SECURING OF SHADOW MASK AND SUBSTRATE ON SUSCEPTOR OF DEPOSITION APPARATUS

CROSS-REFERENCE TO RELATED APPLICATION

This application claims priority under 35 U.S.C. §119(e) to U.S. Provisional Patent Application No. 61/558,132, filed on Nov. 10, 2011, which is incorporated by reference herein in its entirety.

BACKGROUND

1. Field of Art

The present invention relates to securing of a shadow mask and a substrate for depositing one or more layers of materials on the substrate.

2. Description of the Related Art

Various chemical processes are used to deposit material on a substrate. Such chemical processes include chemical vapor deposition (CVD), atomic layer deposition (ALD) and molecular layer deposition (MLD). CVD is the most common method for depositing a layer of material on a substrate. In CVD, reactive gas precursors are mixed and then delivered to a reaction chamber where a layer of material is deposited after the mixed gas comes into contact with the substrate.

ALD is another way of depositing material on a substrate. ALD uses the bonding force of a chemisorbed molecule that is different from the bonding force of a physisorbed molecule. In ALD, source precursor is absorbed into the surface of a substrate and then purged with an inert gas. As a result, physisorbed molecules of the source precursor (bonded by the Van der Waals force) are desorbed from the substrate. However, chemisorbed molecules of the source precursor are covalently bonded, and hence, these molecules are strongly adsorbed in the substrate and not desorbed from the substrate. The chemisorbed molecules of the source precursor (adsorbed on the substrate) react with and/or are replaced by molecules of reactant precursor. Then, the excessive precursor or physisorbed molecules are removed by injecting the purge gas and/or pumping the chamber, obtaining a final atomic layer.

MLD is a thin film deposition method similar to ALD but in MLD, molecules are deposited onto the substrate as a unit to form polymeric films on a substrate. In MLD, a molecular fragment is deposited during each reaction cycle. The precursors for MLD have typically been homobifunctional reactants. MLD method is used generally for growing organic polymers such as polyamides on the substrate.

In order to perform such deposition methods on a substrate, the substrate may be placed below a shadow mask onto a susceptor in a deposition device. The susceptor may move across reactors, selectively exposing portions of the substrate corresponding to patterned areas of the shadow mask to different materials and radicals injected by the reactors. Although it is preferable to maintain a short distance between the reactors and the substrates during the movement, deformations and protruding components (e.g., shadow mask) in the deposition device may limit further reducing of the distance between the reactors and the substrates.

SUMMARY

Embodiments relate to a deposition device including a reactor, a susceptor and a shadow mask where a mechanism for securing the shadow mask to the susceptor is provided on the surface of the shadow mask other than on a top surface. The reactor injects one or more materials or radicals for depositing material on a substrate. The susceptor moves across the reactor to expose different portions of the substrate mounted on the susceptor to the one or more materials or radicals. The top surface of the shadow mask and the top surface of the susceptor adjacent to the shadow mask are substantially coplanar when the shadow mask is secured to the susceptor.

In one embodiment, the shadow mask includes a frame and a stencil. The frame is provided with the mechanism for securing the shadow mask to the susceptor. The mechanism is provided on surfaces of the frame other than the top surface of the frame. The stencil is secured to the frame and is formed with patterns to expose selected regions of the substrate to the materials or radicals.

In one embodiment, the mechanism includes portions of the frame formed with recesses.

In one embodiment, the mechanism includes a plurality of latches that can be locked into recesses formed on the susceptor.

In one embodiment, the mechanism is provided at outer side surfaces, bottom surfaces or inner side surfaces of the frame.

In one embodiment, the stencil is formed of metal and the susceptor includes at least one magnet to pull the stencil towards the susceptor.

In one embodiment, the depositing device further includes a motor to move the susceptor linearly in a reciprocating manner.

In one embodiment, the depositing device includes members to raise the shadow mask to place the substrate below the shadow mask or to remove the substrate from the susceptor.

In one embodiment, the depositing device further includes members to raise the substrate for removal from the susceptor or to lower the substrate onto the susceptor.

Embodiments are also related to a method of securing a substrate. The substrate is placed below a shadow mask and above a susceptor. The shadow mask is lowered onto the substrate and the susceptor. A locking mechanism interacting with side surfaces or the bottom surfaces of the shadow mask is operated to lock the shadow mask and the substrate to the susceptor in a position where the top surface of the shadow mask is coplanar with the top surface of portions of the susceptor adjacent to the shadow mask. The susceptor is moved to expose different portions of the substrate to materials or radicals for depositing material on selected portions of the substrate.

In one embodiment, the locking mechanism is operated to unlock the shadow mask from the susceptor after moving the susceptor. The shadow mask is raised above the susceptor after operating the locking mechanism to unlock the shadow mask. The substrate exposed to the materials or the radicals is raised after raising the shadow mask.

In one embodiment, the lock mechanism is operated by rotating latches from an unlocked position to a locked position.

DETAILED DESCRIPTION OF EMBODIMENTS

Figure 1:
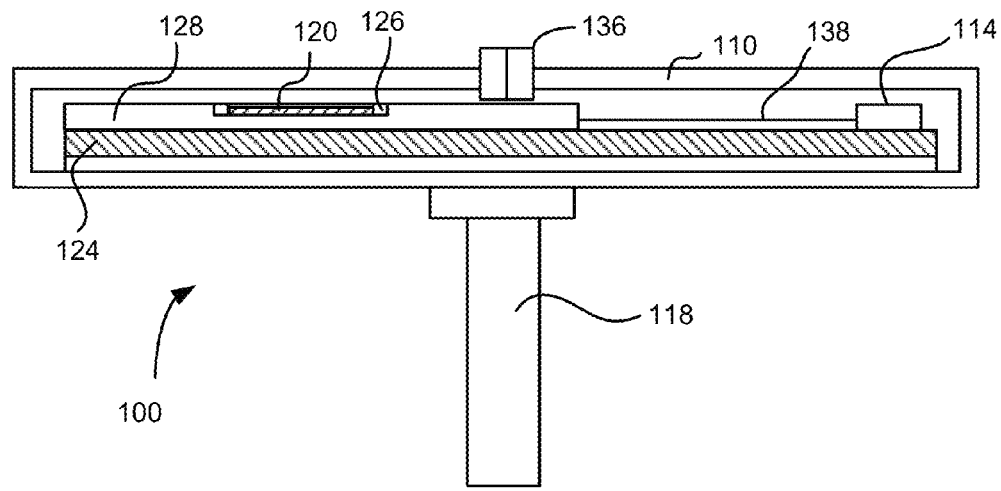
FIG. 1 is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to a structure for securing a shadow mask and a susceptor where the top surface of the shadow mask mounted with the susceptor is flush with the top surface of the susceptor adjacent to the shadow mask. When the susceptor is mounted with the shadow mask, the entire top surfaces of the susceptor and the shadow mask are substantially coplanar. A substrate onto which material is deposited is placed below the shadow mask. The susceptor moves below reactors for injecting materials or radicals. Since the entire top surface of the susceptor is substantially flat, the vertical distance between the reactors and the susceptor can be reduced, contributing to the overall quality of the layer formed on the substrate and reducing the materials wasted by leaking outside the gap between the susceptor and the reactors.

Figure 2:
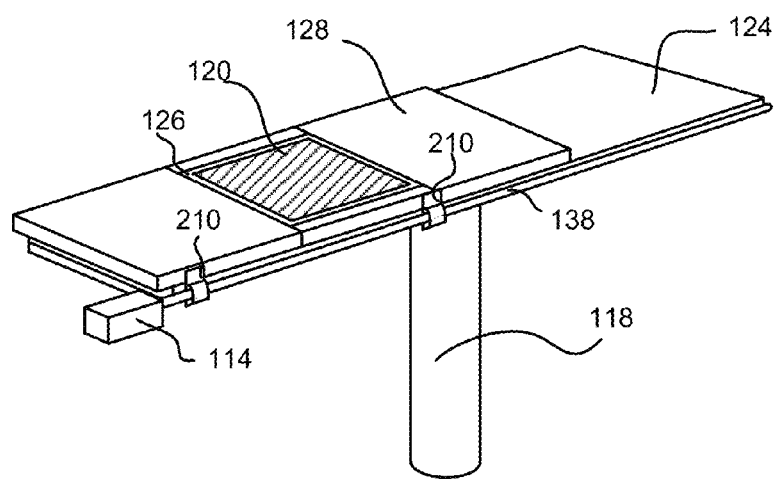
FIG. 2 is a perspective view of a linear deposition device, according to one embodiment.

FIG. 1 is a cross sectional diagram of a linear deposition device 100, according to one embodiment. FIG. 2 is a perspective view of the linear deposition device 100 (without chamber walls to facilitate explanation), according to one embodiment. The linear deposition device 100 may include, among other components, a support pillar 118, a process chamber 110 and one or more reactors 136. The reactors 136 may include one or more of injectors and radical reactors. Each of the reactors 136 injects source precursors, reactant precursors, purge gases or a combination of these materials onto the substrate 120. The linear deposition device 100 may perform chemical vapor deposition (CVD), atomic layer deposition (ALD), molecular layer deposition (MLD) or a combination thereof.

The process chamber enclosed by the walls may be maintained in a vacuum state to prevent contaminants from affecting the deposition process. The process chamber 110 contains a susceptor 128 which receives a shadow mask 126 and a substrate 120 below the shadow mask 126. The susceptor 128 is placed on a support plate 124 for a sliding movement. The support plate 124 may include a temperature controller (e.g., a heater or a cooler) to control the temperature of the substrate 120. The linear deposition device 100 may also include mechanisms to facilitate loading of the substrate 120 onto the susceptor 128 or dismounting of the substrate 120 from the susceptor 128, as described below in detail with reference to FIG. 5.

It is preferable to reduce the gap between the reactors 136 and the top surface of the susceptor 128. By reducing the gap, (i) the materials injected by the reactors 136 are less likely to mix in areas other than on the substrate 120, (ii) less materials injected by the reactors 136 are likely to leak beyond the reactors 136, (iii) more physisorbed precursor molecules are likely to be removed by injection of purge gas due to higher pressure of the purge gas, and (iv) the radicals generated by the reactors 136 are less likely to revert back to an inert state due to shorter travel distance of the radicals. However, the gap between the reactors 136 and the top surface of the susceptor 128 should not be too small as to cause collision between the susceptor 128 and the reactors 136. Especially, components for securing the shadow mask 126 and the substrate 120 should not protrude above the top surface of the susceptor 128 to cause collision with the reactors 136.

In one embodiment, the susceptor 128 is secured to brackets 210 that move across an extended bar 138 with screws formed thereon. The brackets 210 have corresponding screws formed in their holes for receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. By controlling the speed and rotation direction of the motor 114, the speed and direction of the linear movement of the susceptor 128 can be controlled. The use of a motor 114 and the extended bar 138 is merely an example of a mechanism for moving the susceptor 128. Various other ways of moving the susceptor 128 (e.g., use of gears and pinion at the bottom, top or side of the susceptor 128). Moreover, instead of moving the susceptor 128, the susceptor 128 may remain stationary and the reactors 136 may be moved.

Figure 3A:
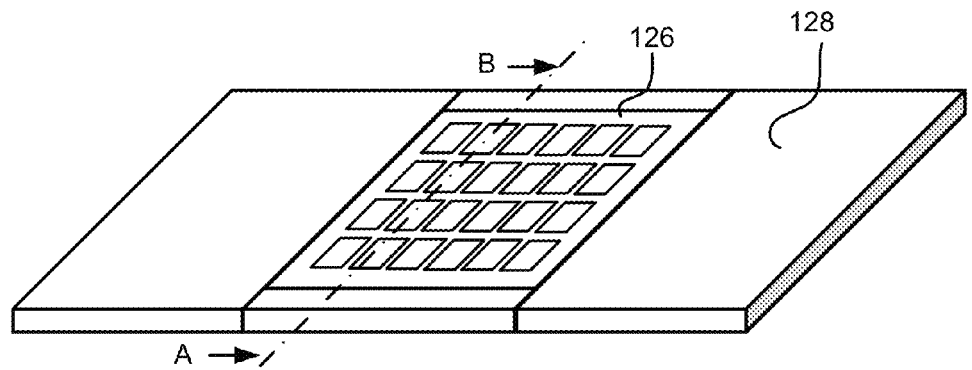
FIG. 3A is a perspective view of a susceptor with a shadow mask lowered onto the susceptor, according to one embodiment.

FIG. 3A is a perspective view of the susceptor 128 with the shadow mask 126 lowered onto the susceptor 128, according to one embodiment. The shadow mask 126, when lowered and locked onto the susceptor 128, has a top surface that is substantially flush (i.e., coplanar) with the top surface of the susceptor 128 adjacent to the shadow mask 126. An example structure of the shadow mask 126 is described below in detail with reference to FIG. 4.

Figure 3B:
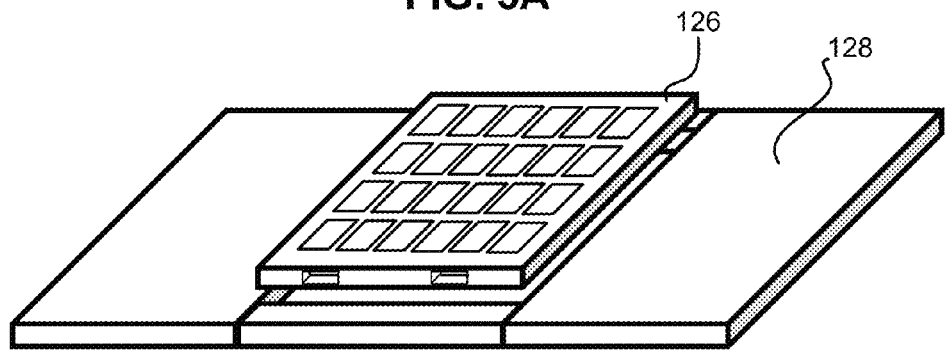
FIG. 3B is a perspective view of a susceptor with the shadow mask raised from the susceptor, according to one embodiment.

FIG. 3B is a perspective view of the susceptor 128 with the shadow mask 126 raised from the susceptor 128, according to one embodiment. The shadow mask 126 is raised from the susceptor 128 by using a raising mechanism described, for example, below in detail with reference to FIG. 5.

Figure 3C:
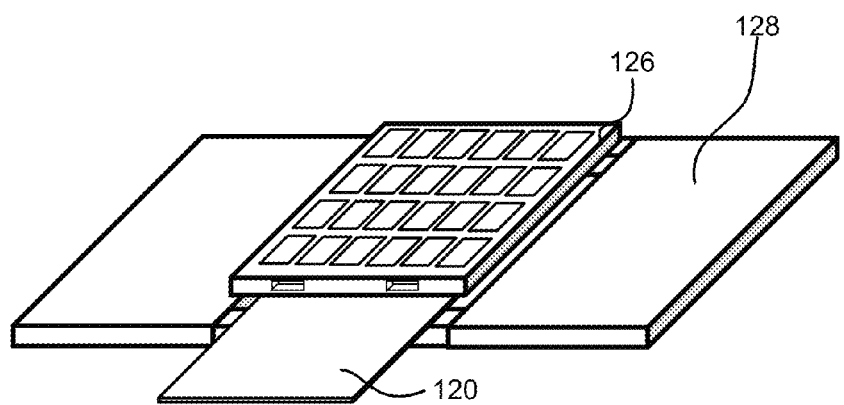
FIG. 3C is a perspective view illustrating insertion of a substrate below the shadow mask, according to one embodiment.

After the shadow mask 126 is raised, the substrate 120 can be inserted into or removed from the susceptor 128, as illustrated in FIG. 3C. In one embodiment, a robotic arm (not shown) is used for moving the substrate 120 into or out of an area between the susceptor 128 and the shadow mask 126.

Figure 4:
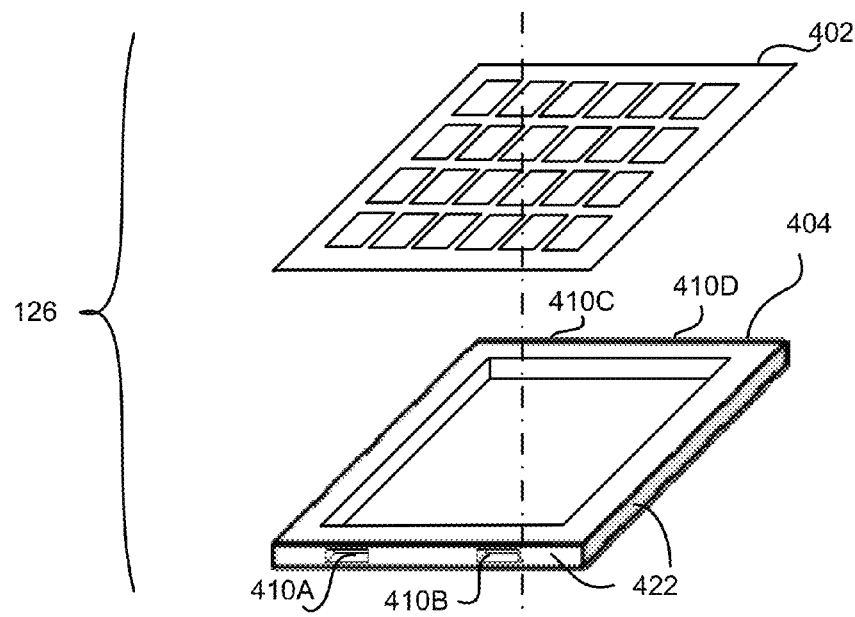
FIG. 4 is an exploded view of a shadow mask according to one embodiment.

FIG. 4 is an exploded view of the shadow mask 126, according to one embodiment. The shadow mask 126 may include, among other components, a frame 404 and a stencil 402. The frame 404 and the stencil 402 may be secured using various methods such as welding or adhesives. The stencil 402 is a patterned thin plate that enables selective regions of the substrate 120 to come in contact with materials or radicals injected by the reactors 136.

The frame 404 has recesses 410A through 410D formed at its outer side surfaces 422. Each of the recesses 410A through 410D receives one of latches 512A through 512D to lock the shadow mask 126 to the susceptor 128. Although the recesses 410A through 410D are illustrated as having a rectangular profile, recesses of different shapes may also be used.

Figure 5:
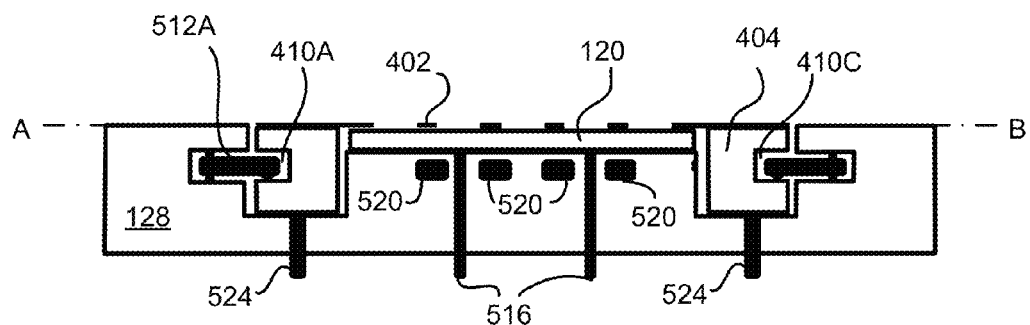
FIG. 5 is a cross sectional view of the susceptor taken along line A-B of FIG. 3A, according to one embodiment.

FIG. 5 is a cross sectional view of the susceptor 128 taken along line A-B of FIG. 3A, according to one embodiment. The substrate 120 is placed below the stencil 402 of the shadow mask 126 and within the frame 404. The shadow mask 404 is locked onto the susceptor 128 using latches 512A through 512D. The latches 512A through 512D may be rotated between a locking position and an unlocking position by a mechanism operated by mechanical links or rods (not shown).

Although the embodiments described above with reference to FIGS. 3A through 5 have latches 512A through 512D formed on the susceptor 128 and the recesses 410A through 410D formed on the frame 404, in other embodiments, latches are formed on the frame and the recesses are formed on the susceptor. Alternatively, a combination of recesses and susceptor may be formed on the frame and the susceptor. Also, other types of locking mechanism such as screws and screw holes may be used.

In one embodiment, the stencil 402 is made of metal. The susceptor 128 includes magnets 520 placed below the area where the substrate 120 is placed to attract the stencil 402 towards the substrate 120. By attracting the stencil 402 to the substrate 120, the likelihood and amount of materials or radicals seeping into areas of the substrate where materials should be blocked can be reduced. Further, by preventing billowing of the middle section of the stencil 402, the collision between the reactors 136 and the stencil 402 can be prevented.

The susceptor 128 also includes lift rods 524 that may be operated to raise the shadow mask 404 after the latches 512A through 512D are rotated into an unlocking position. The susceptor 128 also includes substrate rods 516 that may be operated to raise the substrate 120 from the susceptor 128 after the shadow mask 404 is lifted. After raising the substrate 120, the substrate 120 may be removed from the susceptor 128 using a robotic arm (not shown). Alternatively, the susceptor rods 516 may be raised to receive a new unprocessed substrate. After the new substrate is placed on the susceptor rods 516, the susceptor rods 516 may be lowered to place the new substrate on the susceptor 128. Subsequently, the shadow mask 404 may be lowered by the lift rods, and then locked by the latches 512A through 512D.

Although above embodiments were described using a substrate that is shaped in a square and moved linearly in the deposition device 100, in other embodiments, the substrate can have other shapes (e.g., circular) and/or be rotated within a circular susceptor for exposure to different materials and/or radicals. In such embodiments, the shadow masks may include a frame of a hollow cylindrical shape. The latches or recesses may be formed on the outer side surfaces of the frame to lock the shadow masks and the substrate to the circular susceptor.

Figure 6:
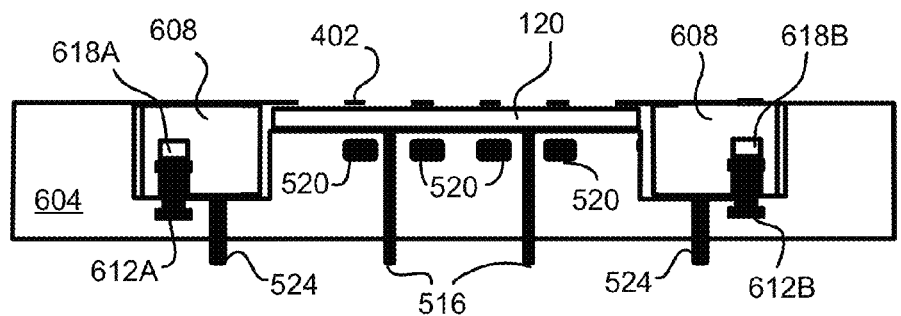
FIG. 6 is a cross sectional view of a susceptor, according to another embodiment.

In other embodiments, a locking mechanism for the substrate is provided at the bottom surfaces and/or at the inner side surface of the frame. FIG. 6 is a cross-sectional diagram of a susceptor 604 that has the same structure as the susceptor of FIG. 5 except that latches 612A, 612B are rotated vertically to clamp the bottom surfaces of the frame 608 of the shadow mask. Recesses 618A, 618B are formed on the frame 608 to receive the latches 612A, 612B as the latches 612A, 612B rotate from an unlocked position into a locked position. The latches 612A, 612B or other components for clamping the shadow mask to the susceptor 604 do not protrude from the tope surface of the susceptor 604, thereby enabling the entire top surface of the susceptor 604 and the top surface of the stencil 402 to remain flush.

Figure 7:
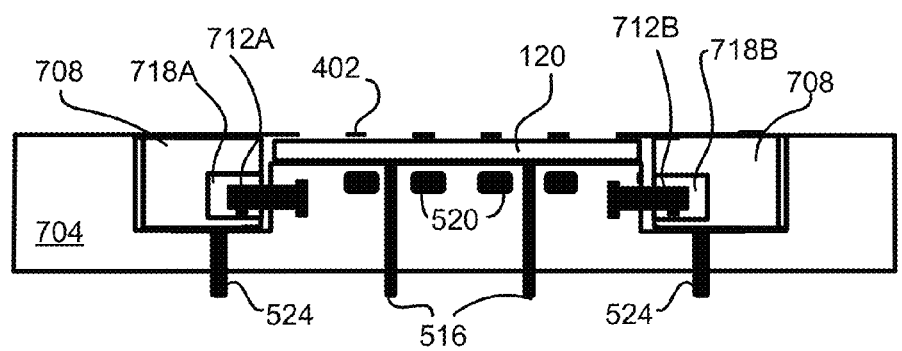
FIG. 7 is a cross sectional view of a susceptor, according to an alternative embodiment.

FIG. 7 is a cross-sectional diagram of a susceptor 704 that has the same structure as the susceptor of FIG. 5 except that latches 712A, 712B are rotated to clamp inner surfaces of the frame 708 of the shadow mask. Recesses 718A, 718B are formed on the inner surfaces of the frame 708 to receive the latches 712A, 712B as the latches 712A, 712B rotate from an unlocked position into a locked position. The latches 712A, 712B or other components for clamping the shadow mask to the susceptor 604 do not protrude from the tope surface of the susceptor 704, thereby enabling the entire top surface of the susceptor 704 and the top surface of the stencil 402 to remain flush.

Figure 8:
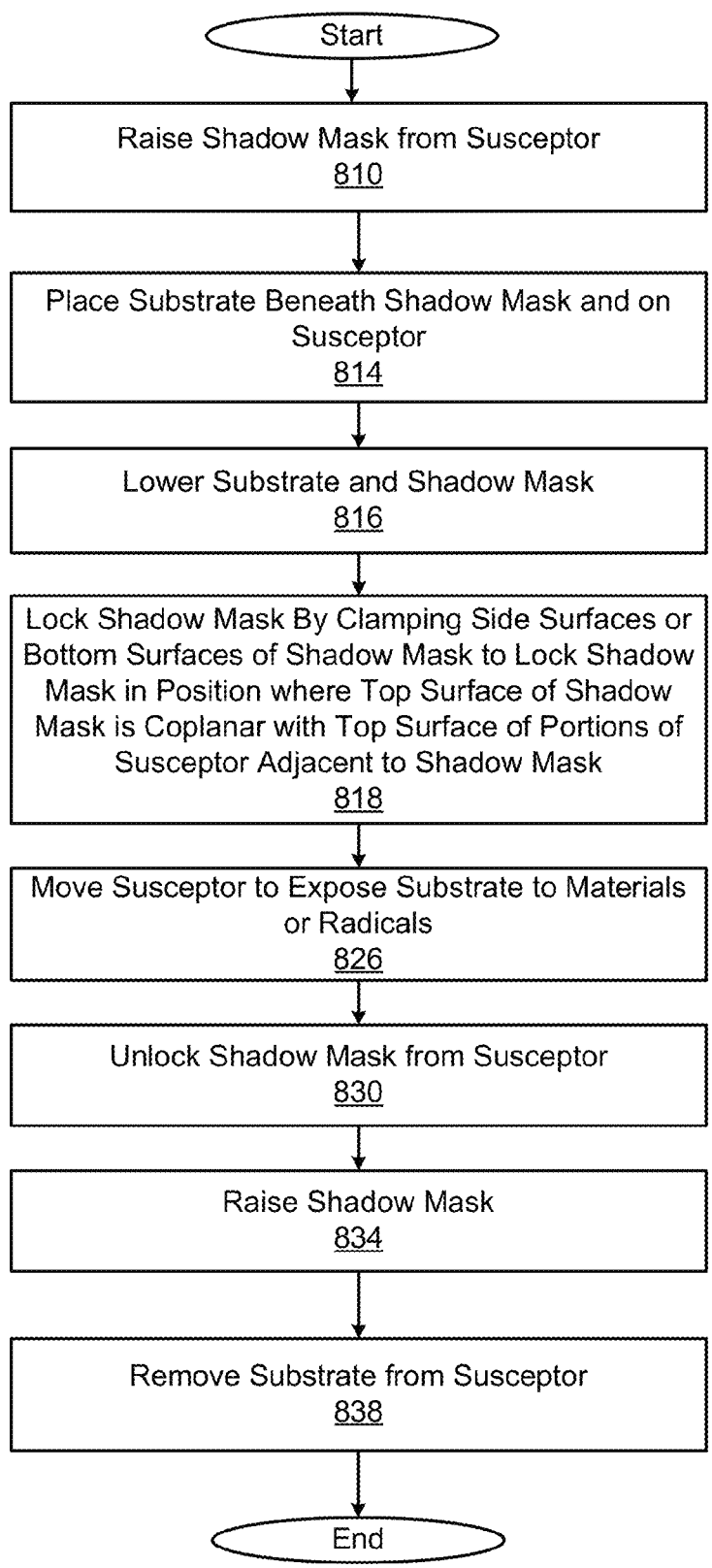
FIG. 8 is a flowchart illustrating a process of mounting, processing and removing of a substrate for deposition, according to one embodiment.

FIG. 8 is a flowchart illustrating a process of mounting, processing and removing of a substrate for deposition, according to one embodiment. In order to mount the substrate to the susceptor, the shadow mask is raised 810 from the susceptor by the lift rods. The substrate is then placed 814 beneath the shadow mask and on the susceptor by a robotic arm.

Then the substrate and the shadow mask are lowered 816 onto the susceptor. After lowering the shadow mask, the shadow mask is locked 818 by clamping side surfaces or bottom surfaces of the shadow mask into a position where the top surface of the shadow mask is coplanar with the top surface of portions of the susceptor adjacent to shadow mask. In one or more embodiments, latches provided in the susceptor or the shadow mask are rotated from an unlocked position to a locked position to clamp the substrate.

The susceptor is then moved 826 across the injectors to expose the substrate to materials or radicals. After depositing or processing of the substrate in the depositing device is finished, the shadow mask is unlocked 830 from the susceptor. In one or more embodiments, latches provided in the susceptor or the shadow mask are rotated from the locked position into the unlocked position.

After unlocking the shadow mask, the shadow mask is raised 834. Then the processed substrate is removed 838 from the susceptor. After unloading the processed substrate, the process may return to the step of placing 814 a new substrate beneath the shadow and on the susceptor, and subsequent steps are repeated.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A deposition device comprising:
   a reactor configured to inject one or more materials or radicals;
   a susceptor configured to move across the reactor to expose different portions of a substrate mounted on the susceptor to the one or more materials or radicals to deposit material; and
   a shadow mask secured onto the substrate, the shadow mask comprising:
      a frame provided with a mechanical locking structure configured to secure the shadow mask to the susceptor, the mechanism provided on surfaces of the frame other than a top surface of the frame; and
      a stencil secured onto the frame and formed with patterns to expose the selected regions of the substrate to the materials or radicals, wherein a top surface of the stencil and a top surface of portions of the susceptor adjacent to the stencil are substantially coplanar when the frame is secured to the susceptor.

2. The deposition device of claim 1, wherein the mechanism comprises a section of the frame formed with recesses.

3. The deposition device of claim 1, wherein the mechanism comprises a plurality of latches that can be locked into recesses formed on the susceptor.

4. The deposition device of claim 1, wherein the mechanism is provided at outer side surfaces, bottom surfaces or inner side surfaces of the frame.

5. The deposition device of claim 1, wherein the stencil is formed of metal and the susceptor comprises at least one magnet to pull the stencil towards the susceptor.

6. The deposition device of claim 1, further comprising a motor to move the susceptor linearly in a reciprocating manner.

7. The deposition device of claim 1, further comprising first members to raise the shadow mask to place the substrate below the shadow mask or to remove the substrate from the susceptor.

8. The deposition device of claim 7, further comprising second members to raise the substrate for removal from the susceptor or to lower the substrate onto the susceptor.

9. A shadow mask placed on a substrate for depositing material on selected regions of the substrate, comprising:
a frame provided with a mechanical locking structure configured to secure the shadow mask to a susceptor, the mechanism provided on surfaces of the frame other than a top surface of the frame; and
a stencil secured onto the frame and formed with patterns to expose the selected regions of the substrate to materials or radicals injected for depositing the material on the selected regions of the substrate, wherein a top surface of the stencil and a top surface of the susceptor substantially coplanar when the frame is secured to the susceptor.

10. The shadow mask of claim 9, wherein the mechanism comprises a section of the frame formed with recesses.

11. The shadow mask of claim 9, wherein the mechanism comprises a plurality of latches that can be locked into recesses formed on the susceptor.

12. The shadow mask of claim 9, wherein the mechanism is provided at outer side surfaces, bottom surfaces or inner side surfaces of the frame.

13. The shadow mask of claim 9, wherein the stencil is formed of metal.

* * * * *